(12) United States Patent
Lin

(10) Patent No.: US 9,331,686 B2
(45) Date of Patent: May 3, 2016

(54) METHOD AND APPARATUS FOR REDUCING POWER BOUNCING OF INTEGRATED CIRCUITS

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 20 days.

(21) Appl. No.: 14/296,503

(22) Filed: Jun. 5, 2014

(65) Prior Publication Data

US 2015/0358017 A1  Dec. 10, 2015

(51) Int. Cl.
*G05F 1/00*  (2006.01)
*G05F 3/02*  (2006.01)
*H03K 17/16* (2006.01)

(52) U.S. Cl.
CPC .................................. *H03K 17/162* (2013.01)

(58) Field of Classification Search
CPC .................................................... H03K 17/162
USPC .................................. 327/530–532, 538, 540
See application file for complete search history.

(56) References Cited

U.S. PATENT DOCUMENTS 6,906,582 B2 * 6/2005 Kase .......................... G05F 1/56
323/316
8,836,414 B2 * 9/2014 Fefer ....................... G06F 1/565
327/538

* cited by examiner

*Primary Examiner* — Kenneth B Wells
(74) *Attorney, Agent, or Firm* — McClure, Qualey & Rodack, LLP

(57) ABSTRACT

A circuit is provided having a core circuit for sinking a first current from a first internal power supply node, a power bouncing reduction circuit for receiving power from a second internal power supply node and sourcing a second current to the first internal power supply node in accordance with a change of voltage at the first internal power supply node, and a package for coupling the first internal power supply node and the second internal power supply node to a first external power supply node and a second external power supply node, respectively. A corresponding method is also provided.

6 Claims, 7 Drawing Sheets

METHOD AND APPARATUS FOR REDUCING POWER BOUNCING OF INTEGRATED CIRCUITS

BACKGROUND OF THE INVENTION

1. Field of the Invention

The present invention relates to integrated circuits.

2. Description of Related Art

Persons of ordinary skill in the art understand terms and basic concepts related to microelectronics that are used in this disclosure, such as PMOS (p-channel metal-oxide semiconductor) transistor, NMOS (n-channel metal-oxide semiconductor) transistor, "inductor," "capacitor," "resistor," "voltage," "current," "circuit node," "inverting-amplifier," "non-inverting amplifier," "negative-feedback," "source follower," "class-AB output stage," "high-pass filter," and "biasing." Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

An integrated circuit (IC) comprises a large number transistors fabricated on a silicon substrate. The integrated circuit is packaged in an appropriate form so that it can be placed as an IC component on a printed circuit board. The integrated circuit receives power from a power supply circuit on the printed circuit board.

As depicted in FIG. 1A, a circuit 100 comprises: a power supply circuit 130 and an IC component 140. The power supply circuit 130 provides a power supply voltage Vps for IC component 140. The IC component 140 comprises an integrated circuit 110 and a package 120, which can be behaviorally modeled as a circuit comprising a combination of a shunt capacitor 122 and a serial inductor 123. The voltage that the integrated circuit 110 actually receives is an internal power supply voltage Vdd, which is different from Vps that the power supply circuit 130 provides. The integrated circuit 110 comprises a large number of transistors working on a variety of tasks that vary from time to time, and the current I that the integrated circuit 110 is sinking also varies from time to time, due to the dynamic nature of the activities of the integrated circuit 110. As a result, the received voltage Vdd also dynamically changes in accordance with the activities of the integrated circuit 110.

An exemplary waveform is shown in FIG. 1B. Trace 180 denotes the current I that the integrated circuit 110 is sinking; trace 190 denotes the internal power supply voltage Vdd. As shown in FIG. 1B, a sudden surge of the current (due to a sudden increase in circuit activities) induces a bouncing of the voltage due to an interplay between the inductor 123, the capacitor 122, and the integrated circuit 110. The phenomenon that the internal power supply voltage Vdd starts ringing upon a sudden surge of current of the integrated circuit 110 is known as "power bouncing." Power bouncing is highly undesirable, as it reduces the reliability of the integrated circuit 110. A package with smaller inductance can be used to alleviate the power bouncing problem; however, a lower inductance package is usually more expensive.

What is to be desired is a method and apparatus for reducing power bouncing without using low inductance package.

BRIEF SUMMARY OF THIS INVENTION

An objective of the present invention is to reduce bouncing of an internal power supply voltage within an integrated circuit.

Another objective of this invention is to rapidly source a current to a power supply node when a voltage at the power supply node is rapidly drooping due to a sudden surge in activities of circuits that receive power from the internal power supply node.

In an embodiment, an integrated circuit component comprises: a core circuit for sinking a first current from a first internal power supply node; a power bouncing reduction circuit for receiving power from a second internal power supply node and sourcing a second current to the first internal power supply node in accordance with a change of voltage at the first internal power supply node; and a package for coupling the first internal power supply node and the second internal power supply node to a first external power supply node and a second external power supply node, respectively. In an embodiment, the change of voltage at the first internal power supply node is detected by a high-pass filter. In an embodiment, the second current is a steady quiescent current that is substantially smaller than the first current when the voltage at the first internal power supply node is steady.

In an embodiment, the power bouncing reduction circuit comprises: a high-pass filter, an amplifier, and an output stage configured in a negative-feedback loop to stabilize the voltage at the first internal power supply node. In an embodiment, the amplifier is an inverting amplifier and the output stage is a source follower comprising a NMOS transistor. In another embodiment, the amplifier is a non-inverting amplifier and the output stage is a class-AB output stage comprising a PMOS transistor.

In another embodiment, a method comprises: receiving a first supply voltage at a first circuit node; receiving a second supply voltage from a second circuit node; high-pass filtering the first supply voltage to obtain a high-pass filtered voltage; amplifying the high-pass filtered voltage into a control voltage; and sourcing a current from the second circuit node to the first circuit node via a device controlled by the control voltage.

DETAILED DESCRIPTION OF THIS INVENTION

The present invention relates to integrated circuits. While the specifications describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
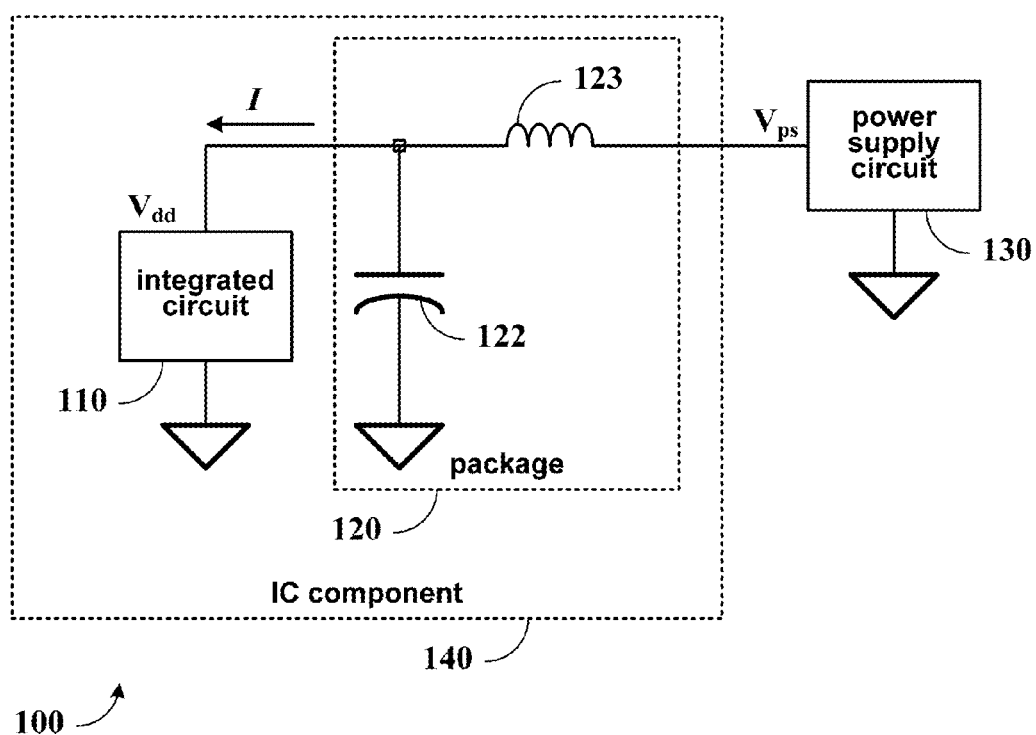
FIG. 1A shows a functional block diagram of a conventional circuit comprising a power supply and an IC component.
Figure 1B:
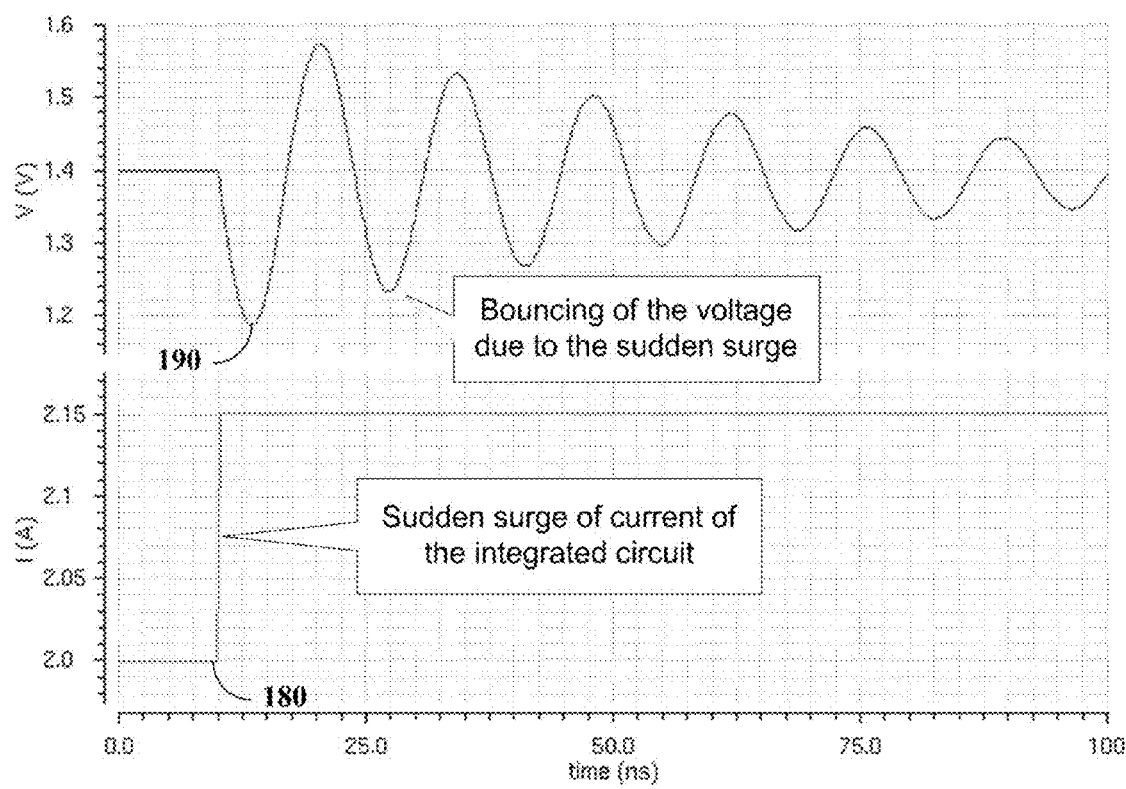
FIG. 1B shows an exemplary waveform of a power bouncing.
Figure 2:
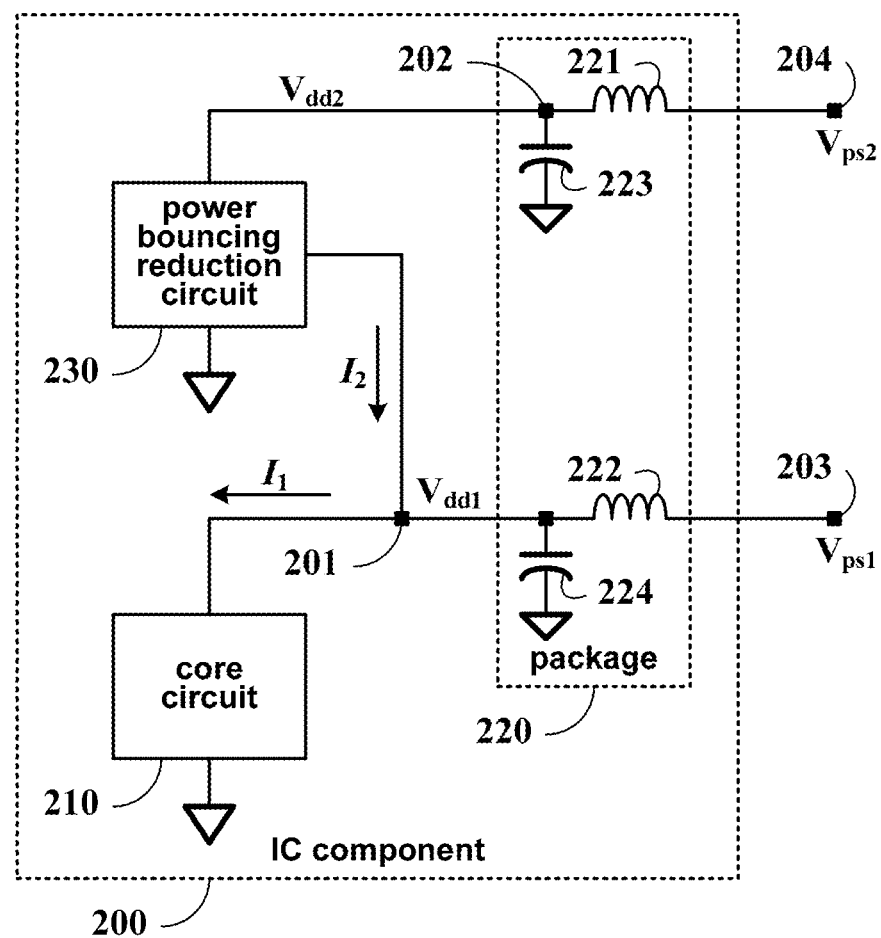
FIG. 2 shows a functional block diagram of an IC component in accordance with an embodiment of the present invention.

As shown in FIG. 2, a packaged IC component 200 in accordance with an embodiment of the present invention comprises: a core circuit 210, a package 220, and a power bouncing reduction circuit 230. The core circuit 210 receives power from a first external power supply voltage Vps1 at a first external power supply node 203 via the package 220; while the power bouncing reduction circuit 230 receives power from a second external power supply voltage Vps2 at a second external power supply node 204, also via the package 220. Note that serial inductors 221 and 222, and shunt capacitors 223 and 224 are part of a behavioral model of the package 220. Due to coupling through the package 220, the voltage that the core circuit 210 actually receives is a first internal power supply voltage Vdd1 (at circuit node 201), while the voltage that the power bouncing reduction circuit 230 actually receive is a second internal power supply voltage Vdd2 (at circuit node 202). The core circuit 210 sinks a first current I1 from the circuit node 201. The power bouncing reduction circuit 230 sources a second current I2 into the circuit node 201 in response to a change of the first internal power supply voltage Vdd1. Under a normal steady state operation condition where the first current I1 is steady, the first internal power supply voltage Vdd1 will also be steady; in this case, the second current I2 is a steady quiescent current that is substantially smaller than the first current I1. Under a fast transition condition where the first current I1 is rapidly surging, the first internal power supply voltage Vdd1 will be rapidly drooping; in this case, the power bouncing reduction circuit 230 senses the rapid drooping of the first internal power supply voltage Vdd1 and in response rapidly increases the second current I2 to counteract the rapid drooping of the first internal power supply voltage Vdd1. By way of example but not limitation, in one embodiment, the first external power supply voltage Vps1 is 1.5V and the second external power supply voltage Vps2 is 3.3V. Regardless, the second external power supply voltage Vps2 must be sufficiently higher than the first external power supply voltage Vps1 to enable the power bouncing reduction circuit 230 to effectively source the second current I2 into the circuit node 201.

Figure 3:
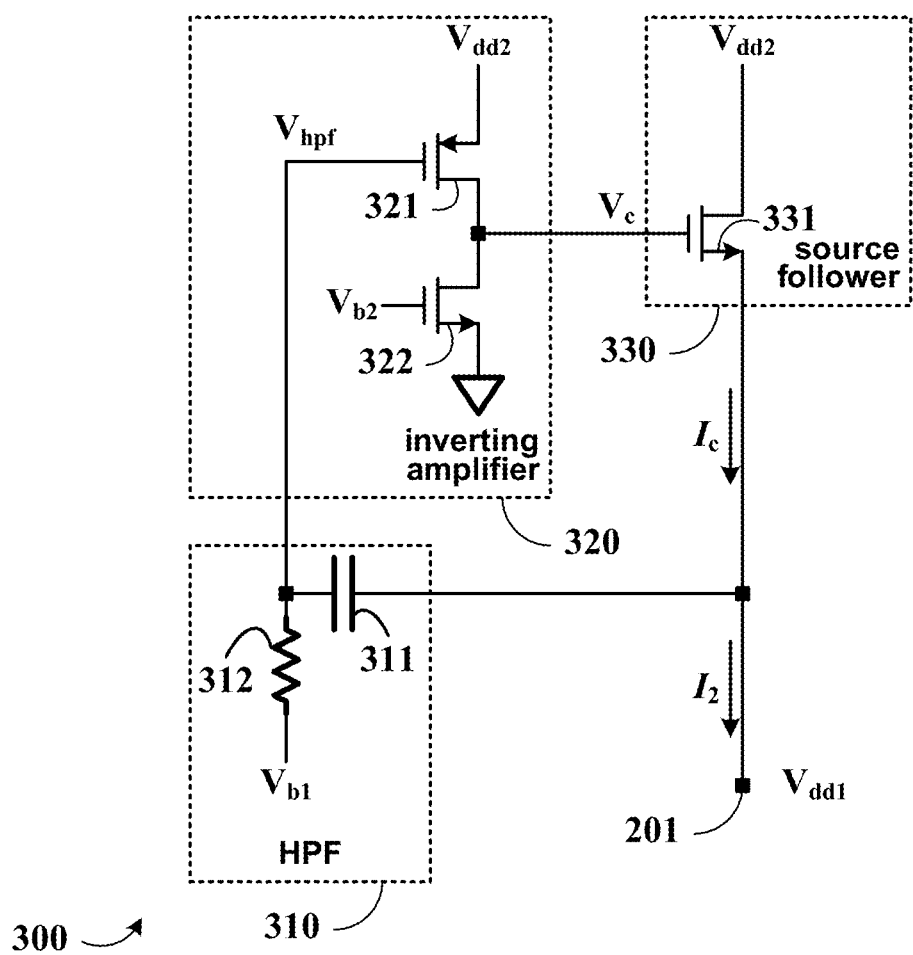
FIG. 3 shows a schematic diagram of a power bouncing reduction circuit in accordance with an embodiment of the present invention.

A schematic diagram of a power bouncing reduction circuit 300 suitable for embodying the power bouncing reduction circuit 230 of FIG. 2 is depicted in FIG. 3. Power bouncing reduction circuit 300 comprises: a high-pass filter (HPF) 310 for receiving the first internal power supply voltage Vdd1 and outputting a high-pass filtered voltage Vhpf; an inverting amplifier 320 for amplifying the high-pass filtered voltage Vhpf into a control voltage Vc; and a source follower 330 for receiving the control voltage Vc and outputting a compensation current Ic, which is approximately equal to the second current I2 that is sourced to the circuit node 201 of the first internal power supply voltage Vdd1. HPF 310 comprises a serial capacitor 311 and a shunt resistor 312. Here, Vb1 denotes a first biasing voltage. Inverting amplifier 320 comprises a PMOS transistor 321 and a NMOS transistor 322. Vb2 denotes a second biasing voltage. Source follower 330 comprises a NMOS transistor 331. HPF 310, inverting amplifier 320, and source follower 330 forms a negative-feedback loop to stabilize the first internal power supply voltage Vdd1 in the event of a power bouncing. A rapid falling (rising) Vdd1 will induce a rapid falling (rising) Vhpf, resulting a rapid rising (falling) Vc, and thus a rapid increasing (decreasing) Ic to counteract the rapid falling (rising) of Vdd1. When the first internal power supply voltage Vdd1 is steady, the high-pass filtered voltage Vhp will settle to the first biasing voltage Vb1, and the control voltage Vc will settle to a pre-determined level such that the compensation current Ic is a quiescent current determined by the second biasing voltage Vb2. Using a higher level of Vb2 leads to a lower level of Vc and thus a lower quiescent current for Ic that consumes less power but is less effective in reducing the bouncing of Vdd1; on the other hand, using a lower level of Vb2 leads to higher level of Vc and thus a higher quiescent current for Ic that consumes more power but is more effective in reducing the bouncing of Vdd1. Therefore, there is a trade-off between power consumption and capability of reducing power bouncing.

Figure 4:
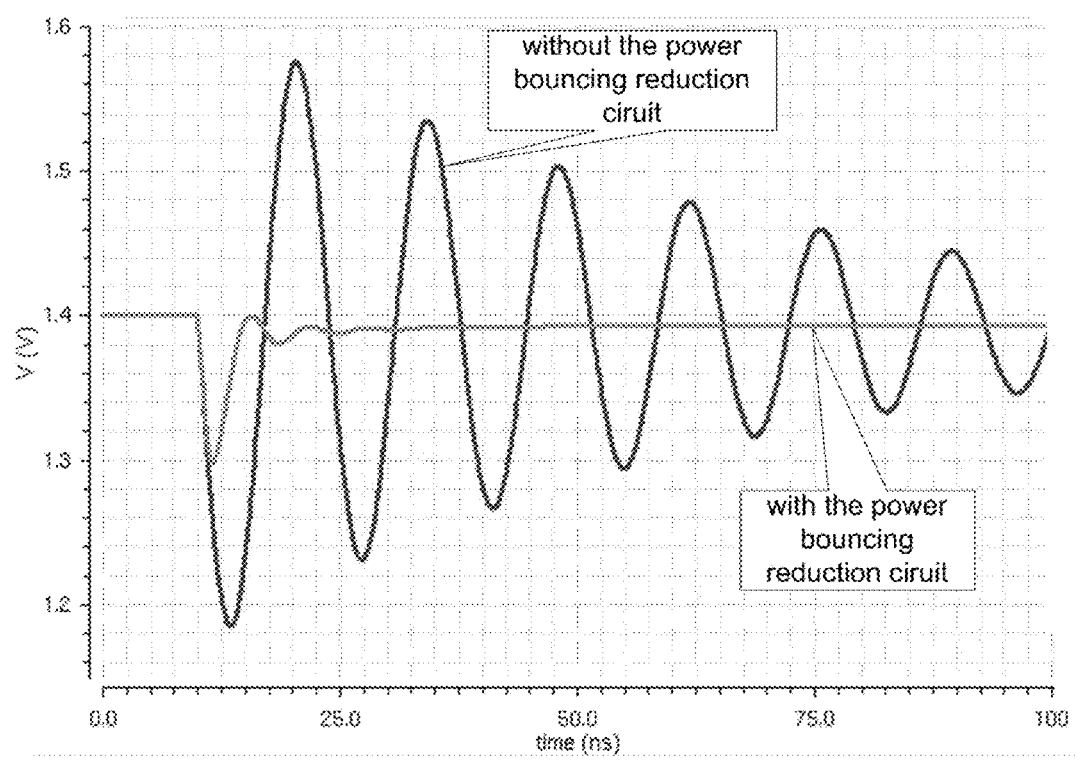
FIG. 4 shows a simulation result for the power bouncing reduction circuit of FIG. 3.

A result of a circuit simulation for the voltage waveform of the first internal power supply voltage Vdd1 in response to a sudden surge of the first current I1 (please refer to FIG. 2) for the power bouncing reduction circuit 300 is shown in FIG. 4. Two traces are shown for comparison: one with the power bouncing reduction circuit, and the other without the power bouncing reduction circuit. It is evident that the power bouncing reduction circuit greatly reduces the power bouncing.

Figure 5:
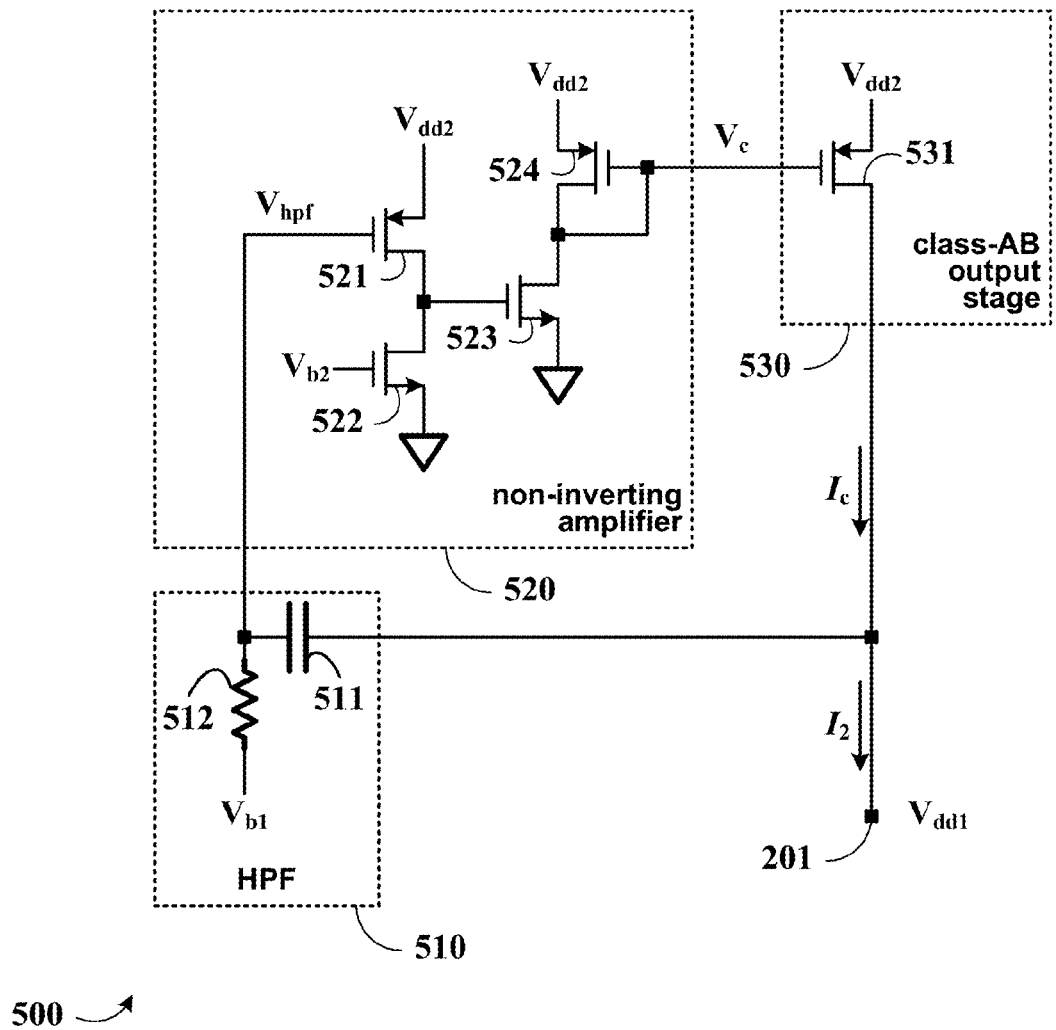
FIG. 5 shows a schematic diagram of an alternative power bouncing reduction circuit in accordance with an alternative embodiment of the present invention.

A schematic diagram of an alternative power bouncing reduction circuit 500 that is also suitable for embodying the power bouncing reduction circuit 230 of FIG. 2 is depicted in FIG. 5. Power bouncing reduction circuit 500 comprises: a high-pass filter (HPF) 510 for receiving the first internal power supply voltage Vdd1 and outputting a high-pass filtered voltage Vhpf; a non-inverting amplifier 520 for amplifying the high-pass filtered voltage Vhpf into a control voltage Vc; and a class-AB output stage 530 for receiving the control voltage Vc and outputting a compensation current Ic, which is approximately equal to the second current I2 that is sourced to the circuit node 201 of the first internal power supply voltage Vdd1. HPF 510 comprises a serial capacitor 511 and a shunt resistor 512. Here, Vb1 denotes a first biasing voltage. Non-inverting amplifier 520 comprises two PMOS transistor 521 and 524 and two NMOS transistors 522 and 523. Vb2 denotes a second biasing voltage. Class-AB output stage 530 comprises a PMOS transistor 531. Power bouncing reduction circuit 500 of FIG. 5 is similar to the power bouncing reduction circuit 300 of FIG. 3; the major difference is that a PMOS transistor, instead of a NMOS transistor, is used for outputting the compensation current Ic, therefore, a non-inverting amplifier, instead of an inverting amplifier, is used to fulfill the negative-feedback function. Those skilled in the art will recognize that the negative-feedback loop in FIG. 5 might act more slowly than the negative feedback loop in FIG. 3, due to increased circuit delay. However, the circuit of FIG. 5 has more voltage headroom than the circuit of FIG. 3, and thus is more suitable when Vdd2 is not much higher than Vdd1.

Figure 6:
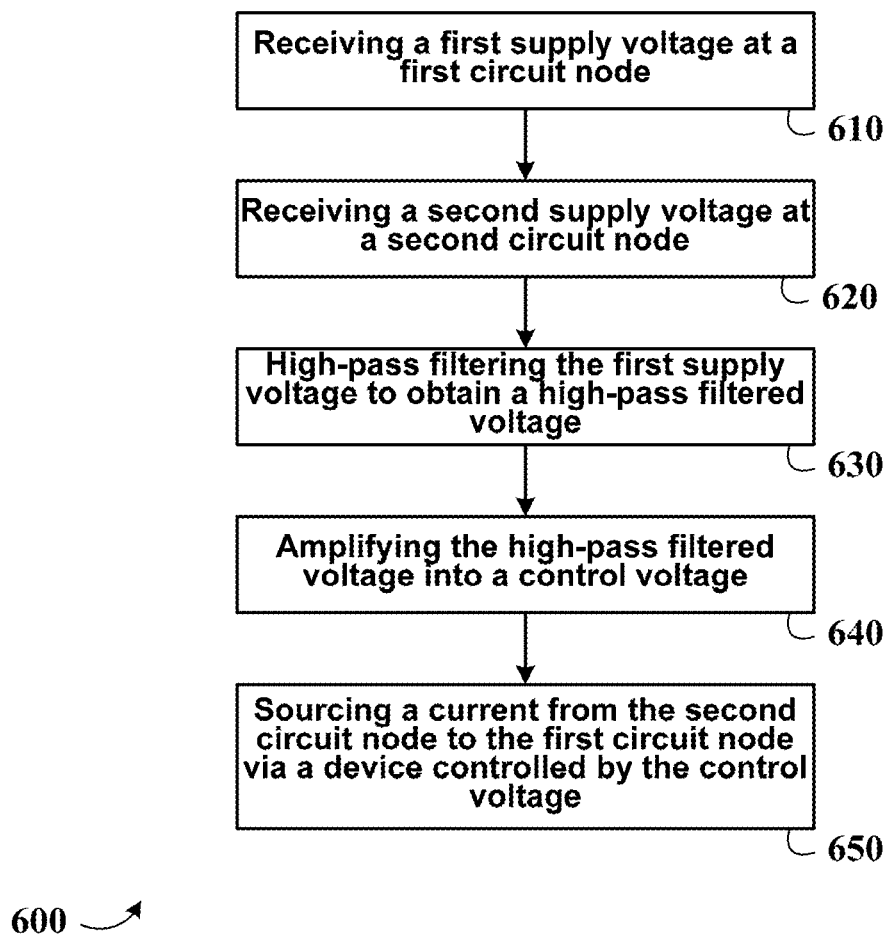
FIG. 6 shows a flow chart of a method in accordance with the present invention.

As demonstrated by a flow chart 600 shown in FIG. 6, a method comprises: step 610 for receiving a first supply voltage at a first circuit node; step 620 for receiving a second supply voltage from a second circuit node; step 630 for high-pass filtering the first supply voltage to obtain a high-pass filtered voltage; step 640 for amplifying the high-pass filtered voltage into a control voltage; and step 650 for sourcing a current from the second circuit node to the first circuit node via a device controlled by the control voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A circuit comprising:
   a core circuit operative to sink a first current from a first internal power supply node;

a power bouncing reduction circuit operative to receive power from a second internal power supply node and sourcing a second current to the first internal power supply node in accordance with a change of voltage at the first internal power supply node, wherein the power bouncing reduction circuit comprises: a high-pass filter operative to receive the voltage at the first internal power supply node and outputting a high-pass filtered voltage; an amplifier operative to receive the high-pass filtered voltage and outputting a control voltage; and an output stage for sourcing the second current from the second internal power supply node to the first internal power supply node in accordance with a control by the control voltage; and a package operative to couple the first internal power supply node and the second internal power supply node to a first external power supply node and a second external power supply node, respectively.

2. The circuit of claim 1, wherein the second current is a steady quiescent current that is substantially smaller than the first current when the voltage at the first internal power supply node is steady.

3. A circuit comprising:
a core circuit operative to sink a first current from a first internal power supply node;
a power bouncing reduction circuit operative to receive power from a second internal power supply node and sourcing a second current to the first internal power supply node in accordance with a change of voltage at the first internal power supply node, wherein the power bouncing reduction circuit comprises: a high-pass filter, an amplifier, and an output stage configured in a negative-feedback loop to stabilize the voltage at the first internal power supply node, and
a package operative to couple the first internal power supply node and the second internal power supply node to a first external power supply node and a second external power supply node, respectively.

4. The circuit of claim 3, wherein the amplifier is an inverting amplifier and the output stage is a source follower comprising a NMOS transistor.

5. The circuit of claim 3, wherein the amplifier is a non-inverting amplifier and the output stage is a class-AB output stage comprising a PMOS transistor.

6. A method comprising:
receiving a first supply voltage at a first node;
receiving a second supply voltage at a second node;
high-pass filtering the first supply voltage to obtain a high-pass filtered voltage;
amplifying the high-pass filtered voltage into a control voltage; and
sourcing a current from the second node to the first node via a device controlled by the control voltage.

\* \* \* \* \*